United States Patent [19]

Sovey et al.

[11] Patent Number: 4,664,980
[45] Date of Patent: May 12, 1987

[54] OXIDATION PROTECTION COATINGS FOR POLYMERS

[75] Inventors: James S. Sovey, Strongsville; Bruce A. Banks, Olmsted Township, Cuyahoga County; Michael J. Mirtich, North Olmsted, all of Ohio

[73] Assignee: The United States of America as represented by the Administrator of the National Aeronautics and Space Administration, Washington, D.C.

[21] Appl. No.: 834,977

[22] Filed: Feb. 27, 1986

Related U.S. Application Data

[62] Division of Ser. No. 761,235, Jul. 31, 1985, Pat. No. 4,604,181, which is a division of Ser. No. 649,330, Sep. 14, 1984, Pat. No. 4,560,577.

[51] Int. Cl.⁴ .................. B32B 9/04; B32B 27/00; B32B 27/06
[52] U.S. Cl. .................... 428/421; 428/422; 428/447; 428/473.5; 428/702
[58] Field of Search .................. 427/397.7; 428/473.5, 428/421, 422, 447, 202

[56] References Cited

U.S. PATENT DOCUMENTS

| | | | |
|---|---|---|---|
| 3,514,388 | 5/1970 | Brumfield et al. | 204/192 |
| 3,984,581 | 10/1976 | Dobler et al. | 427/35 |
| 4,091,138 | 5/1978 | Takagi et al. | 428/209 |
| 4,112,137 | 9/1978 | Zega | 427/38 |
| 4,199,650 | 4/1980 | Mirtich et al. | 428/421 |
| 4,574,879 | 3/1986 | DeGree et al. | 428/473.5 X |

*Primary Examiner*—Michael R. Lusignan
*Attorney, Agent, or Firm*—Gene E. Shook; John R. Manning

[57] ABSTRACT

A polymeric substrate 10 is coated with a metal oxide film 22 to provide oxidation protection in low earth orbital environments. The film contains about four volume percent polymer to provide flexibility.

14 Claims, 4 Drawing Figures

OXIDATION PROTECTION COATINGS FOR POLYMERS

ORIGIN OF THE INVENTION

The invention described herein was made by employees of the U.S. Government and may be manufactured and used by or for the Government for governmental purposes without the payment of any royalties thereon or therefor.

STATEMENT OF COPENDENCY

This application is a division of application Ser. No. 761,235 filed July 31, 1985 and now U.S. Pat. No. 4,604,181 which is a division of application Ser. No. 649,330 filed Sept. 14, 1984 and now U.S. Pat. No. 4,560,577.

DESCRIPTION

1. Technical Field

This invention relates to the protection of polymeric materials, such as polyimides. The invention is particularly concerned with providing an oxidation protection barrier to these materials when they are exposed to low earth orbital environments.

Various polymers exhibit weight loss when exposed to a near earth orbital environment. The mechanism appears to be oxidation by the energetic incidence of atomic oxygen atoms associated with high relative velocity of near earth spacecraft and the high abundance of atomic oxygen in low earth orbit. It has been demonstrated that organic polymers, such as polyimides, have high rates of weight loss in this environment.

Because many of these polymers are used as structural or thermal blankets, a problem develops because these materials become so thin through oxidation that they lose their structural or thermal integrity. In particular, a polyimide is typically used as a solar array blanket material. If this material is exposed long enough, mechanical and electrical failures are encountered in the spacecraft power system.

Alternatives to polymers which oxidize have been considered by filling these materials with additives that reduce their oxidation rates. Other solutions have been proposed, such as using alternate materials, including silicon rubber and polytetrafluoroethylene, which exhibit lower oxidation rates. All of these solutions to the orbital oxidation problem represent major changes in design. These solutions also sacrifice other important polymer characteristics, such as strength, weight, optical absorptance, emittance, tearing, creep, and adhesion properties.

It is, therefore, an object of the present invention to provide oxidation protection for polymeric materials, such as polyimides, in a low earth orbital environment.

2. Prior Art

Mirtich and Sovey U.S. Pat. No. 4,199,650 discloses the treating of polyimide and fluorinated ethylene propylene polymers using an electron bombardment argon source. This treatment modifies the electrical and optical properties of the polymers.

Dobler et al U.S. Pat. No. 3,984,581 discloses a method wherein multilayer coatings of silicon oxide and another metal oxide are provided on the surface of an organic polymeric plastic material for antireflective purposes. The oxides are vaporized by an electron beam, and the ionized molecules are deposited on the substrate.

Takagi U.S. Pat. No. 4,091,138 discloses a coating method wherein a metal is ionized in the crucible. This metal is deposited on a film material, such as a polyimide or other thermoplastic resin, to form an electrically conducting insulated coating.

Zega U.S. Pat. No. 4,112,137 is directed to a coating method wherein a metal source is bombarded by an electron beam. This metal is used to coat glass surfaces.

Brumfield et al U.S. Pat. No. 3,514,388 is concerned with a metal plating method for coating a large number of metal and nonmetal parts at the same time using a metal. Argon gasses are employed in the ion plating apparatus.

None of the prior art patents discloses a coating for oxidation protection. Moreover, none of these patents employs an ion beam for cleaning the substrate prior to coating.

DISCLOSURE OF THE INVENTION

A polymer material is exposed to an ion beam to clean absorbed gasses and contaminants from its surface. The ion cleaned polymer surface is then immediately ion beam sputter coated with a protective thin film. Materials may be co-sputtered to form a coating containing both metal oxides and polymers.

The substrate shape, ion specie, ion energy and ion beam current density utilized can be varied. No substantial change in the polymer or materials characteristics is involved. By providing the polymer with a lightweight thin flexible film, all of the demonstrated advantages of the substrate material can be utilized with the added oxidation protection of the oxide polymer coating.

BRIEF DESCRIPTION OF THE DRAWINGS

The advantages and novel features of the invention will be more fully apparent from the following detailed description when read in connection with the accompanying drawings wherein like numerals are used throughout to identify like parts.

BEST MODE FOR CARRYING OUT THE INVENTION

Figure 1:
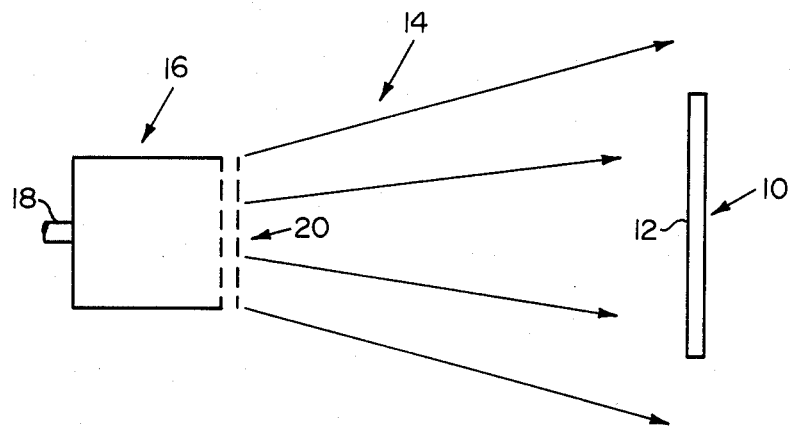
FIG. 1 is a schematic view showing a polymer sheet being ion beam cleaned in accordance with the present invention.

Referring now to the drawings there is shown in FIG. 1 a film or sheet 10 of a polymeric material such as a polyimide known commercially as Kapton having a surface 12 that is to be covered with an oxidation barrier for exposure to a low earth orbital environment. The surface 12 of the sheet 10 is exposed to a beam 14 of 500 eV to 2000 eV argon ions at current densities of 0.1 $mA/cm^2$ to 10 $mA/cm^2$.

The argon ion beam 14 is furnished by an electron bombardment ion source 16 of the type developed for electric propulsion technology. Argon gas from a suitable source, not shown, is fed through a line 18 to a cathode in a chamber within the source 16 where the gas is ionized. The argon ions are retained within this chamber which also contains an anode about its outer periphery. Such an ion source is described in "Advances in Electronic and Electron Physics" by H. R. Kaufman, vol. 36, pages 265-373 (1974). It will be appreciated that other gases, in addition to argon can be used to form the bombarding ions in the beam 14. For example, xenon and hydrogen may be used, and even hydrocarbons may be provided in the ion source 16.

Extraction of the beam 14 is accomplished by a two grid ion optic system 20. Such a system is described in AIAA Paper No. 76-1017 entitled "A 30 cm Diameter Argon Ion Source". Such a double grid system includes both the screen grid and accelerator grid. The screen grid serves to contain the discharge plasma while forming the necessary ion optics to prevent direct impingement of the accelerated ions into the accelerator grid. Ions in the near vicinity of the screen grid have a high probability of being accelerated through the openings in the screen and the accelerator grids because of the high electric fields present at the grids.

Neutralization of the ions is achieved by the interjection of electrons into the beam 14. A suitable neutralizer in the form of a downstream cathode provides these electrons.

The electron bombardment ion source 16 is located in the vacuum facility which is sufficiently large to prevent back sputtered facility materials from contaminating the process. The operating pressure within the vacuum facility during sputtering is about $1 \times 10^{-4}$ torr or lower.

Figure 2:
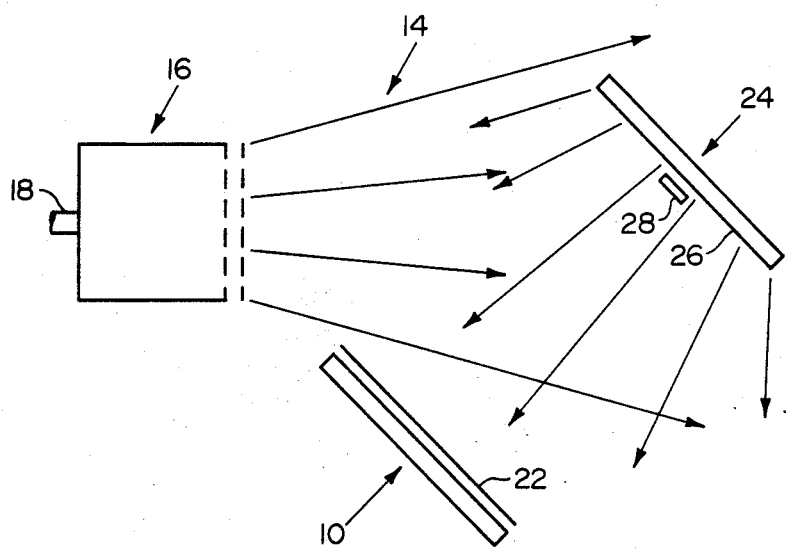
FIG. 2 is a schematic view showing the ion cleaned polymer surface of FIG. 1 being immediately ion beam sputter-coated with a protective thin film.

Immediately after cleaning the polymer sheet 10 is mounted in the vacuum chamber in the position shown in FIG. 2. The ion cleaned surface 12 is then ion sputter coated with a protective thin film 22 having a thickness between about 50 angstroms and about 800 angstroms. This is accomplished by mounting a sputter target 24 in the ion beam 14.

The sputter target 24 is composed of two types of materials. A metal oxide, such as $SiO_2$ or $Al_2O_3$, forms a larger portion 26. A flexible polymer with a low oxidation rate, such as polytetrafluoroethylene or silicone rubber, forms a small portion 28.

These target material portions 26 and 28 may be either spatially separated or overlapping. The purpose of the metal oxide materials is to provide an already oxidized surface on the polymer to be protected. A protective coating 22 consisting essentially of 100% metal oxide may not have suitable flexibility to retain good integrity without cracking or spalling on substrates 10 that are expected to be bent over a small radii of curvature. Thus, the purpose of the polymer portion 28 of the sputter target 24 is to provide a small amount, i.e. less than about 20 volume percent, of molecularly mixed polymer content to the protecting film 22 to give it additional flexible properties.

The area of the polymer target portion 28 is typically much smaller than the metal oxide target portion 26 because only a small amount of the polymer produces a large gain in film flexibility. Also, it is desirable to have the oxidation protection dominated by the metal oxide of the larger portion 26.

Alternate Embodiments of the Invention

Figure 3:
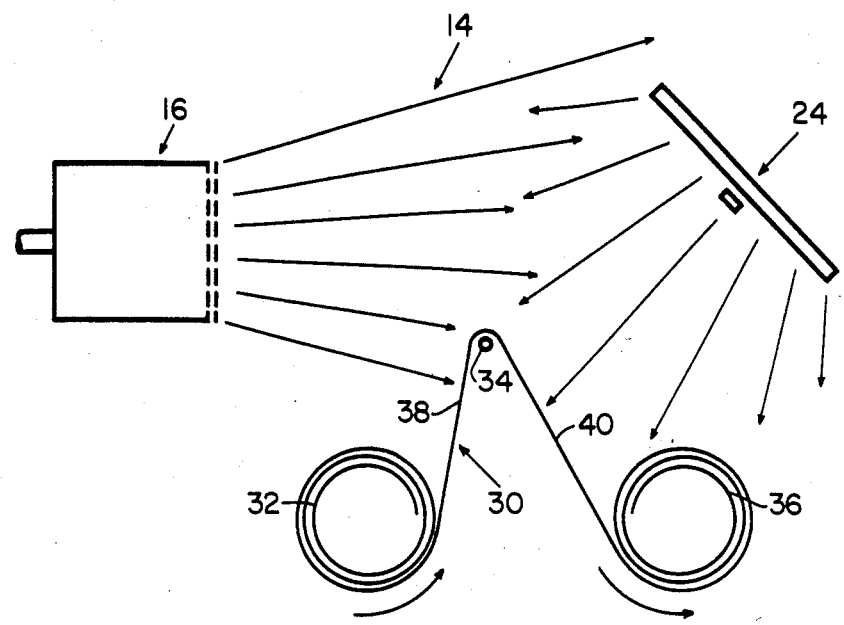
FIG. 3 is a schematic view showing a single ion source for both ion cleaning and codeposition.
Figure 4:
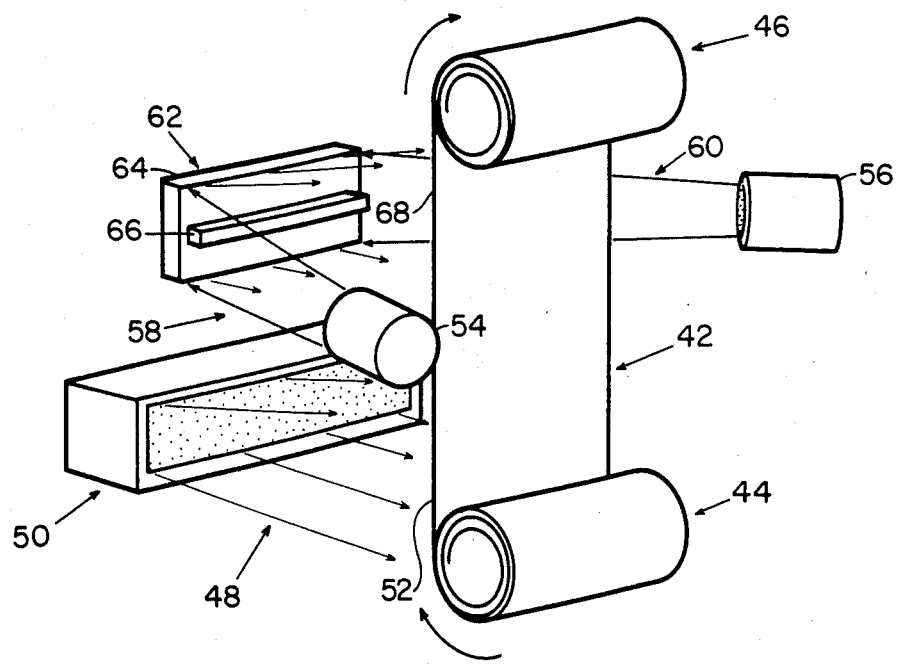
FIG. 4 is a schematic view showing an alternate embodiment of the invention utilizing multiple ion sources for ion cleaning and codeposition.

Referring now to FIGS. 3 and 4, there is shown reel to reel production of a coated polymer material in coiled form. In the embodiment of FIG. 3 the same ion beam is used for both sputter cleaning and film deposition in the manner shown in FIGS. 1 and 2. In the embodiment of FIG. 4 separate ion beams are used for cleaning and film deposition.

Referring now to FIG. 3 a coil of polymer material 30 to be coated passes from a payout reel 32 over a roller 34 to a takeup reel 36. The roller 34 is located in the ion beam 14. A target of the type shown in FIG. 2 is likewise mounted in the ion beam 14.

As the polymer material 30 moves from the payout reel 32 to the roller 34, a surface portion 38 is ion beam cleaned in the manner described above in connection with FIG. 1. After the ion beam cleaned surface portion passes over the roller 34, a predetermined surface portion 40 is coated in a manner described above in connection with the embodiment shown in FIG. 2.

In the embodiment of FIG. 4 a coil of polymer material 42 to be coated is fed from a payout reel 44 to a takeup reel 46 in a manner similar to that described above in connection with the embodiment shown in FIG. 3. A beam 48 of argon ions from a source 50 cleans a surface portion 52 of the polymer material 42 in the manner described above in connection with the embodiment of FIG. 1.

A pair of ion sources 54 and 56 provide ion beams 58 and 60, respectively, to bombard a target 62 in the manner discussed above in connection with FIG. 2. The target 62 is similar to the target 24 in that it includes a metal portion 64 and a polymer portion 66. A surface portion 68 of the polymer material 42 is coated in the manner described above in connection with FIG. 2 as the material moves between the reel 44 and the reel 46.

In all the aforementioned embodiments the deposited films are typically 50 angstroms-800 angstroms thick. This thickness provides desirable flexibility and surface protection.

By way of example, a polymer material was covered with a coating comprising 96 volume percent of $SiO_2$ and 4 volume percent polytetrafluoroethylene in accordance with the present invention. This coating reduced oxidation rates of the polyimide material by a factor of at least five hundred in shuttle orbiter tests.

While several embodiments of the invention have been described it will be appreciated that various modifications can be made without departing from the spirit of the invention or the scope of the subjoined claims. For example, the metal oxide portions 26 and 64 of the targets 24 and 62 may be any oxide whose mechanical, optical, electrical and adhesion properties are desirable. Conductive metal oxides, such as indium and/or tin oxide, may be used to provide a conductive as well as an oxidation protecting surface. It is further contemplated that the metal oxide and/or polymer sputter deposited coating 22 may be a mixture of one or more oxides and/or polymers.

In certain applications the sputter cleaning and metal oxide deposition could be accomplished by RF sputter cleaning and RF sputter deposition. Also, D.C. sputter deposition or electron beam evaporation may be used instead of the ion beam cleaning and ion beam deposition of metal oxides. For some polymers, thermal evaporation might be used instead of the ion beam sputtering. Such a thermal evaporation step could be used with polytetrafluoroethylene, for example.

The arrangement of the ion sources as described in FIGS. 1 through 4 and the sputter targets may be spatially varied. Also, the ratio of polymer to metal oxides can be varied. This ratio may be varied from 100% metal oxide to 100% polymer.

We claim:

1. A coated material comprising
   a substrate of a polyimide material, and
   a metal oxide coating on said substrate forming an oxidation barrier, said coating containing less than about 20 volume percent of a molecularly mixed flexible polymer to provide additional flexibility.

2. A coated material as claimed in claim 1 wherein the metal oxide coating contains a flexible polymer having a low oxidation rate.

3. A coated material as claimed in claim 2 wherein said coating contains about 96 volume percent metal oxide and about 4 volume percent flexible polymer.

4. A coated material as claimed in claim 2 wherein the coating is an oxide of a metal selected from the group consisting essentially of silicon, aluminum, indium, and tin.

5. A coated material as claimed in claim 4 wherein the coating is a metal oxide selected from the group consisting essentially of $SiO_2$ and $Al_2O_3$.

6. A coated material as claimed in claim 2 wherein the coating contains a flexible polymer selected from the group consisting essentially of polytetrafluoroethylene and silicone rubber.

7. A coated material as claimed in claim 6 wherein the coating contains about four volume percent of the flexible polymer.

8. A coated material as claimed in claim 1 wherein the metal oxide coating has a thickness between about 50 angstroms and about 800 angstroms.

9. A coated material as claimed in claim 1 wherein the metal oxide coating contains a small amount of several molecularly mixed flexible polymers.

10. A coated material comprising
    a substrate of a polymeric material, and
    a flexible coating on said substrate for forming an oxidation barrier, said flexible coating containing about 96 volume percent of a metal oxide selected from the group consisting essentially of $SiO_2$ and $Al_2O_3$ and about 4 volume percent of a flexible polymer selected from the group consisting essentially of polytetrafluoroethylene and silicone rubber molecularly mixed with said metal oxide.

11. A coated material as claimed in claim 10 wherein the flexible coating comprises about 96 volume percent $SiO_2$ and about 4 volume percent polytetrafluoroethylene thereby reducing the oxidation rates of the polymeric material by a factor of at least five hundred in shuttle orbiter tests.

12. A coated material as claimed in claim 10 wherein the flexible coating comprises an oxide of a conductive metal containing a small amount of a molecularly mixed flexible polymer.

13. A coated material as claimed in claim 12 wherein the flexible coating comprises an oxide of a conductive metal selected from the group consisting essentially of indium and tin containing a small amount of a molecularly mixed flexible polymer.

14. A coated material as claimed in claim 10 wherein the flexible coating has a thickness between about 50 angstroms and about 800 angstroms.

* * * * *